United States Patent
Chang et al.

(10) Patent No.: US 8,054,662 B2
(45) Date of Patent: Nov. 8, 2011

(54) CONTENT ADDRESSABLE MEMORY ARRAY

(75) Inventors: Leland Chang, Yorktown, NY (US);
Gary S. Ditlow, Yorktown, NY (US);
Brian L. Ji, Chappaqua, NY (US);
Robert K. Montoye, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 12/549,752

(22) Filed: Aug. 28, 2009

(65) Prior Publication Data
US 2011/0051483 A1    Mar. 3, 2011

(51) Int. Cl.
*G11C 15/00*    (2006.01)
(52) U.S. Cl. .......... 365/49.1; 365/163; 365/148
(58) Field of Classification Search .......... 365/49.1, 365/163, 148, 230.06, 203
See application file for complete search history.

(56) References Cited

U.S. PATENT DOCUMENTS

| | | | |
|---|---|---|---|
| 5,394,353 A * | 2/1995 | Nusinov et al. | ............ 365/49.11 |
| 6,166,938 A | 12/2000 | Wong | |
| 7,075,841 B2 | 7/2006 | Resta et al. | |
| 7,130,206 B2 | 10/2006 | Ferrant | |
| 7,236,393 B2 | 6/2007 | Cho et al. | |
| 7,319,608 B2 | 1/2008 | Hsu et al. | |
| 7,365,355 B2 | 4/2008 | Parkinson | |
| 7,397,689 B2 | 7/2008 | Liu et al. | |
| 7,420,841 B2 | 9/2008 | Ruf et al. | |
| 7,499,303 B2 * | 3/2009 | Lien et al. | ............ 365/49.1 |
| 7,675,765 B2 * | 3/2010 | Derharcobian et al. | ... 365/49.17 |
| 2008/0205128 A1 | 8/2008 | Nakai | |
| 2008/0298114 A1 | 12/2008 | Liu et al. | |
| 2009/0040814 A1 | 2/2009 | Kang et al. | |
| 2010/0226161 A1 | 9/2010 | Ji et al. | |

OTHER PUBLICATIONS

Kang et al., "Two-Bit Cell Operation in Diode-Switch Phase Change Memory Cells with 90mm Technology" 2008 IEEE; Symposium on VLSI Technology Digest of Tenicla Papers, pp. 98-99.

* cited by examiner

*Primary Examiner* — David Lam
(74) *Attorney, Agent, or Firm* — Cantor Colburn LLP; Vazken Alexanian (57) ABSTRACT

A memory device for storing one or more addresses includes a match line and first and second memory cells that form a 2-bit memory cell. Each memory cell includes two memory elements coupled to a match line and selection lines coupled thereto. The selection lines provide a signal representative of a logical combination of at least two different inputs.

20 Claims, 8 Drawing Sheets

CONTENT ADDRESSABLE MEMORY ARRAY

BACKGROUND

The present invention relates to memory devices, and more specifically, to content addressable memory devices.

Random access memory (RAM) associates data with an address. Volatile RAMs such as dynamic RAM (DRAM) and static RAM (SRAM) are traditionally used in today's computers. However, as wireless mobile computing systems become more popular, intensive research and development in the memory area is now focusing on new non-volatile memories. Important non-volatile RAMs known today are ferroelectric RAM (FeRAM) using non-linear capacitance due to different polarization of the lead-zirconium-titanate (PZT) material, magnetic RAM (MRAM) using the magneto-resistance changes with magnetic polarity, and Chalcogenide phase change materials using resistance changes in ordered (conductive) and disordered (resistive) phases.

Content-addressable memory (CAM) is a special type of computer memory used in certain very high speed searching applications. It is also known as associative memory or associative storage. Most existing CAM products are volatile technologies based on SRAM or DRAM cells. CAMS using a resistance-change memory element such as, for example, Chalcogenide phase change materials, have been found to allow for density improvements in the formation of a CAM.

Unlike standard computer memory (e.g., RAM) in which the user supplies a memory address and the RAM returns the data word stored at that address, a CAM is designed such that the user supplies a data word and the CAM searches its entire memory to see if that data word is stored anywhere in it. If the data word is found, the CAM returns a list of one or more storage addresses where the word was found (and in some architectures, it also returns the data word, or other associated pieces of data). Thus, a CAM is the hardware embodiment of what in software terms would be called an associative array.

Binary CAM is the simplest type of CAM which uses data search words comprised entirely of 1s and 0s. Ternary CAM (TCAM) allows a third matching state of "X" or "Don't Care" for one or more bits in the stored dataword, thus adding flexibility to the search. For example, a ternary CAM might have a stored word of "10XX0" which will match any of the four search words "10000", "10010", "10100", or "10110".

SUMMARY

According to one embodiment of the present invention, a memory device for storing one or more addresses is provided. The memory device includes a match line and first and second memory cells. The first memory cell includes a first memory element coupled to a second memory element and to the match line and also including a first access device coupled to the first memory element and having a first access line and a second access device coupled to the second memory element and having a second access line. The first memory cell is configured to store a first value. The second memory cell includes a third memory element coupled to a fourth memory element and to the match line, the second memory cell also including a third access device coupled to the third memory element having a third access line and a fourth access device coupled to the fourth memory element and having a fourth access line, the second memory cell configured to store a second value. In this embodiment, the at least one of the access lines receives a signal that is a combination of the first and second values.

According to another embodiment of the present invention, a method of operating a content addressable memory is disclosed. The method of this embodiment includes: receiving an input vector at a decoder; decoding the input vector, decoding including dividing the input vector into a plurality of 2 bit groupings and performing on logical operations on each of the groupings to create a plurality of addressing values; transmitting the addressing values to access lines coupled to memory cells within the content addressable memory; and measuring a resistive value of a match line within the content addressable memory and coupled to the memory cells.

Another embodiment of the present invention is directed to a memory system that includes a content addressable memory including plurality of memory cells coupled to a match line and a match checking device coupled content addressable memory that determines if a particular input applied to the content addressable memory is contained the content addressable memory by monitoring a resistive level of the match line. The memory system of this embodiment also includes a decoder coupled to the content addressable memory that receives an input address and decodes at least two of the bits from the address into four unique outputs.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
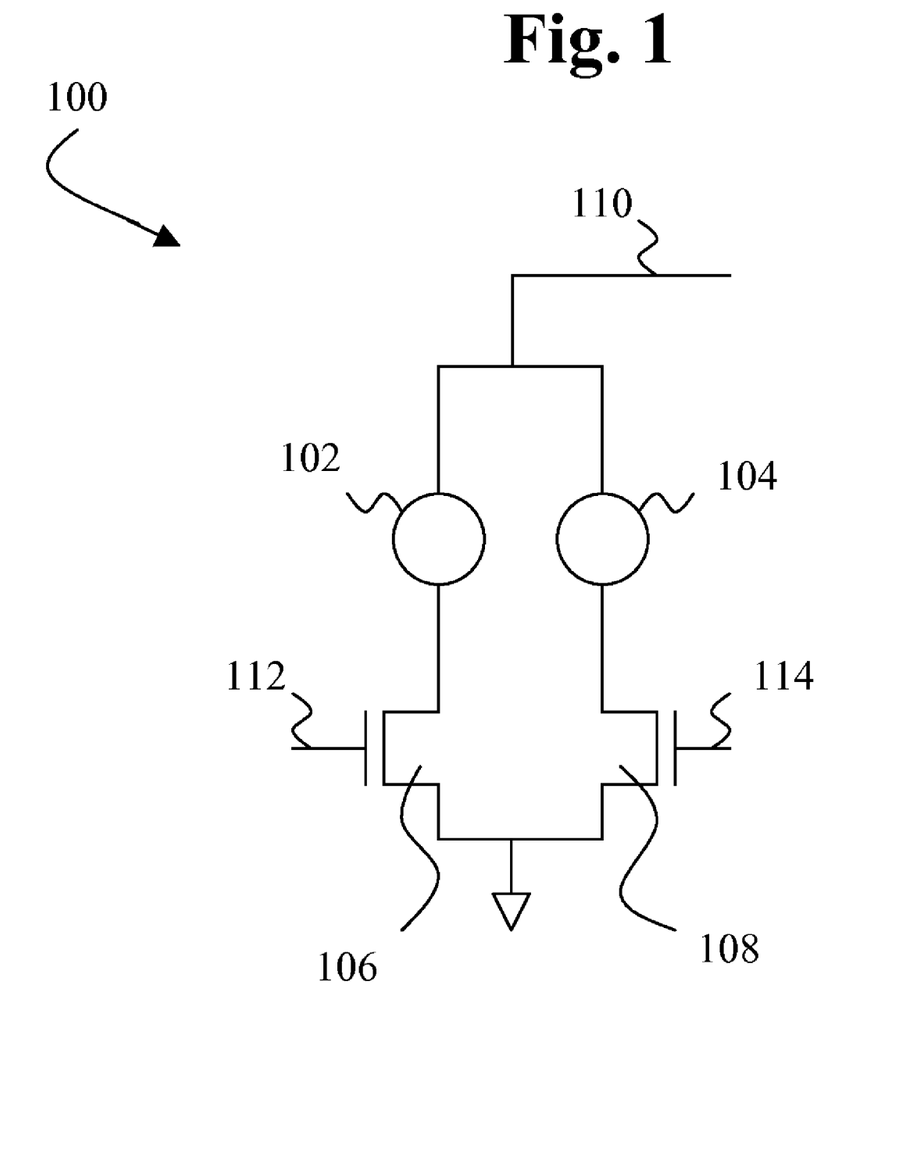
FIG. 1 shows an example of a memory cell for use in a CAM.

An example of a memory cell 100 for use in a CAM is shown in FIG. 1. The memory cell 100 shown in FIG. 1 may be a ternary CAM cell in one embodiment. The memory cell 100 includes a first memory element 102 and a second memory element 104. The first resistive memory element 102 and second memory element 104 are electrically coupled in parallel to a match line 110. The match line 110 may also be utilized as a bit-line in some embodiments. The first memory element 102 and the second memory element 104 may be formed as, for example, a phase change memory element. Phase change material can be utilized to store information in CAM devices and, accordingly may be used as the memory elements in some embodiments. Phase change materials can be manipulated into different phases or states, with each phase representing a different data value. Generally, each phase exhibits different electrical properties. The amorphous and crystalline phases are typically two phases used for binary data storage (1's and 0's) since they have detectable differences in electrical resistance. In a particular configuration of the invention, the first and second memory elements are phase change elements comprised of a phase change material, such as Germanium-Antimony-Tellurium (GST). The memory elements may be programmed to one of two states: a crystalline state or an amorphous state. In the crystalline state (SET), the memory elements exhibit relatively low resistances and require less current to be programmed to. On the other hand, in the amorphous state (RESET), the memory elements have relatively high resistances and require more current to be programmed to. The resistance states of the first and second memory elements are used to store a data bit in a data word. For example, to store a data bit with a low ternary data value, the first memory element is programmed to the low resistance state and the second memory element is programmed to the high resistance state.

Other possibilities for the memory elements include, but are not limited to, resistive memory elements, floating gate field effect transistors (floating gate FETs), Magnetoresistive Random Access Memory (MRAMs), or a charge trapping device.

The memory cell 100 includes a first access device 106 electrically coupled to the first memory element 102, a first access line 106 and a common ground. The memory cell 100 also includes a second access device 108 electrically coupled to the second memory element 108, a second access line 114, and the common ground. The first access device 106 and the second access device 108 may be comprised of, but not limited to, field effect transistors (FET), or bipolar junction transistors (BJT). In one configuration of the invention, the access devices 108 and 110 include source, drain and common terminals. The source terminals of the access devices 106 and 108 are electrically coupled together and to the common ground. The drain terminal of the first access device 106 is electrically coupled to the first memory element 102. The drain terminal of the second access device 108 is electrically coupled to the second memory element 104. The gate terminal of the first access device 106 is electrically coupled to the first access line 114, which functions as the word line during the data storage operation. During a search operation, the first access line also functions as the complementary search line. The gate terminal of the second access device 104 is electrically coupled to the second access line 114, which functions as the complementary word line during the data storage operation and as a search line during a search operation.

As shown the memory cell 100 may have 4 possible states based on the programming of the first memory element 102 and second memory element 104. These combinations are RR, Rr, rR, and rr where R is high resistance and r is a low resistance. These combinations may be used to create the states shown below in Table 1 where the cell state X is the so called "don't care" state.

TABLE 1

| Cell State | First Element Resistive State | Second Element Resistive State |
|---|---|---|
| X | High | High |
| 0 | High | Low |
| 1 | Low | High |

In operation, to read (also referred to as matching) the state of the memory cell 100, the match line 110 is first pre-charged. Next, a particular value (x, 0, or 1) is applied to the first access line 112 and the second access line 114. In most cases, the first access line 112 forms the complement of the second access line 114. That is, if "a" is applied to the second access line 114, a value of "a*" (the complement of a) is applied to the first access line 112. This may be referred to as complementary addressing herein.

To compare the value stored in the cell to a logical "0", the first access line 112 is driven high and the second select line 114 is driven low. To compare the value stored in the cell 100 to a logical "1" the first select line 112 is driven low and the second select line 114 is driven high. In the case that the comparison to be made is a with a "don't care," the values placed on the select lines are irrelevant because both resistors are high valued and will keep the resistance of the match line resistance high.

When the value stored in the cell 100 does not match, the resistance level of the match line 110 falls. For example, assuming that cell 100 is storing a value of 1, the first memory element 102 is in a low resistance state and the second memory element 104 is in a high state. Application of a logical 0 to the access lines (first access line 112 high, second access line 114 low) opens the first access device 106 and, because the first resistor 102 is in a low resistance state, reduces the resistance level of the match line. This lower resistance indicates that a match has not been found.

Of course, in most instances, many cells are connected to a particular match line 110. If one of the cells does not match the value of the bit provided to it on the access lines 112 and 114, the resistance level of the match line 110 falls. Thus, it may be determined if any cell is not matched by monitoring the resistance level of the match line 110.

As discussed above, CAMs utilizing resistance-change memory elements may enable extreme density enhancements. However, these memory elements generally suffer from degraded on/off resistance ratio especially when variability (manifested in resistance distributions) is taken into account. Since the noise margins in CAM applications are degraded over that in traditional memory applications, a robust CAM design using resistance-change memory is difficult to achieve.

In short, it has been discovered that there may be a low sensing margin between a "match" and "no match" condition on the match line 110. The "condition" of the match line may also be referred to herein as the "resistance" of the match line. Embodiments of the present invention may nearly double (or at least increase) the resistance margin by combining every two bits in a CAM and addressing them as a single unit.

Figure 2:
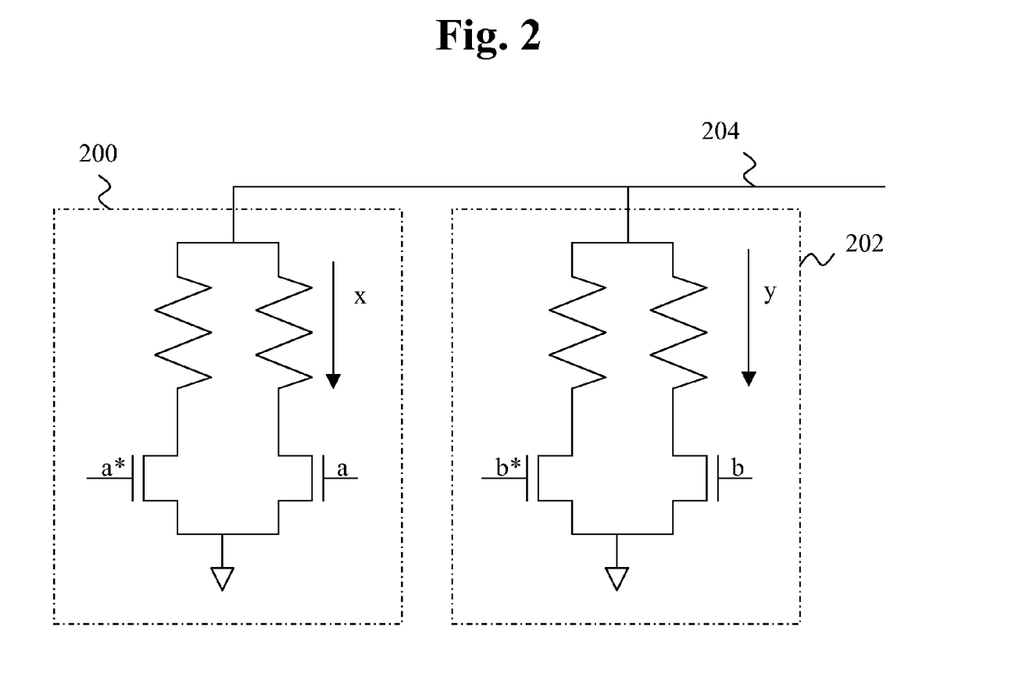
FIG. 2 shows an example of two memory cells coupled to a match line.

FIG. 2 shows an example of two CAM cells that may be addressed individually. The first cell 200 and second cell 202 are both connected to match line 204. Each cell includes two memory elements shown as resistors to emphasis the resistive properties of the memory elements in one embodiment.

The inputs to the access/select lines for the first cell 200 are shown as receiving signals a and a* and the access/select lines of the second cell 202 are shown as receiving b and b* where the * indicates that the signal is the complement of the original signal. In the event that a match between the inputs and the bit stored for both cells 200 and 202 occurs, a pathway through a high resistance resistor from the match line 204 to ground is created in each cell.

From the above description, it will be apparent that each time a cell matches the inputs it is receiving, the cell provides a path through a high resistance state resistive element to ground. As more cells are coupled to the match line 204, the resistive value of the match line decreases for a match condition because the resistors are in parallel for the match condition. For example, two arbitrary examples are shown with pathways x and y in FIG. 2. In short, one of two pull down paths are active for each 1 bit cell coupled to the match line 204 for every matching cell. This reduction in resistance state moves the match and no match conditions closer together and, therefore, makes differentiating match and no match conditions more difficult.

Figure 3:
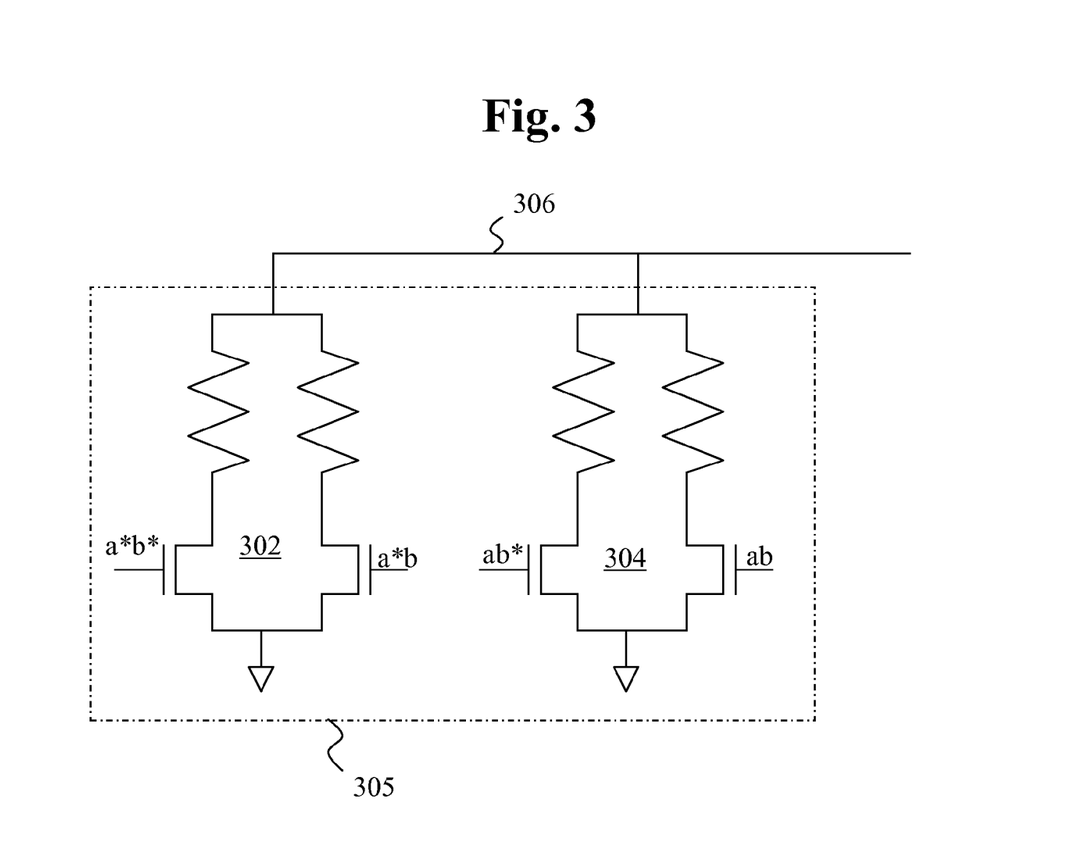
FIG. 3 shows and example of two memory cells coupled to match line where the two memory cells for a 2-bit cell according to one embodiment of the present invention.

FIG. 3 shows one embodiment of the present invention that includes a first memory cell 302 and a second memory cell 304 both coupled to a match line 306. In one embodiment, the resistive elements of the memory cells 302 and 304 are formed of phase change materials. The two memory cells 302 and 304 combined may be referred to as a 2-bit cell 305. In this embodiment, the select lines for each cell may include a combination of the inputs that would have otherwise been used to select the cells individually. For example, the inputs could be, for example, a*b*, a*b, ab*, and ab. As used herein, when two variables are expressed as xy, that expression represents the result of an "and" operation performed on the two values. For example, if a=1 and b=0, ab=0, and if a=1 and b=1, ab=1. Of course, other input schemes could be utilized consistent with the present invention.

Considering that the two cells may each have a one or a zero stored therein, there exists 4 possible combinations of the values collectively stored in the two cells: 00, 01, 10 and 11. Table 2 shows the possible desired match values (including the X, X (don't care) input for use in ternary CAMS) for a combination of the two cells and the resulting values that may be applied to the select lines in the embodiment shown in FIG. 3. The match values are an ordered pair of the bits to be compared to the first cell 302 and the second cell 304, respectively.

TABLE 2

| Match Values | a | a* | b | b* | a*b* | a*b | ab* | ab |
|---|---|---|---|---|---|---|---|---|
| XX | 0 | 0 | 0 | 0 | 0 | 0 | 0 | 0 |
| 00 | 0 | 1 | 0 | 1 | 1 | 0 | 0 | 0 |
| 01 | 0 | 1 | 1 | 0 | 0 | 1 | 0 | 0 |
| 10 | 1 | 0 | 0 | 1 | 0 | 0 | 1 | 0 |
| 11 | 1 | 0 | 1 | 0 | 0 | 0 | 0 | 1 |

Table 2 is effectively a 2 input to 4 output decoder. The actual decoding may be done, for example, in hardware, software, or a combination of both. Of course, the exact decoding scheme utilized may vary without departing from the present invention. In the case that no X values are included in an input search vector, the conversion shown in Table 2 works perfectly. If on the other hand, the input search vector may include X's (e.g., in the case of a TCAM), and a particular pair of inputs includes one X and one value, an exception may be generated.

Figure 4:
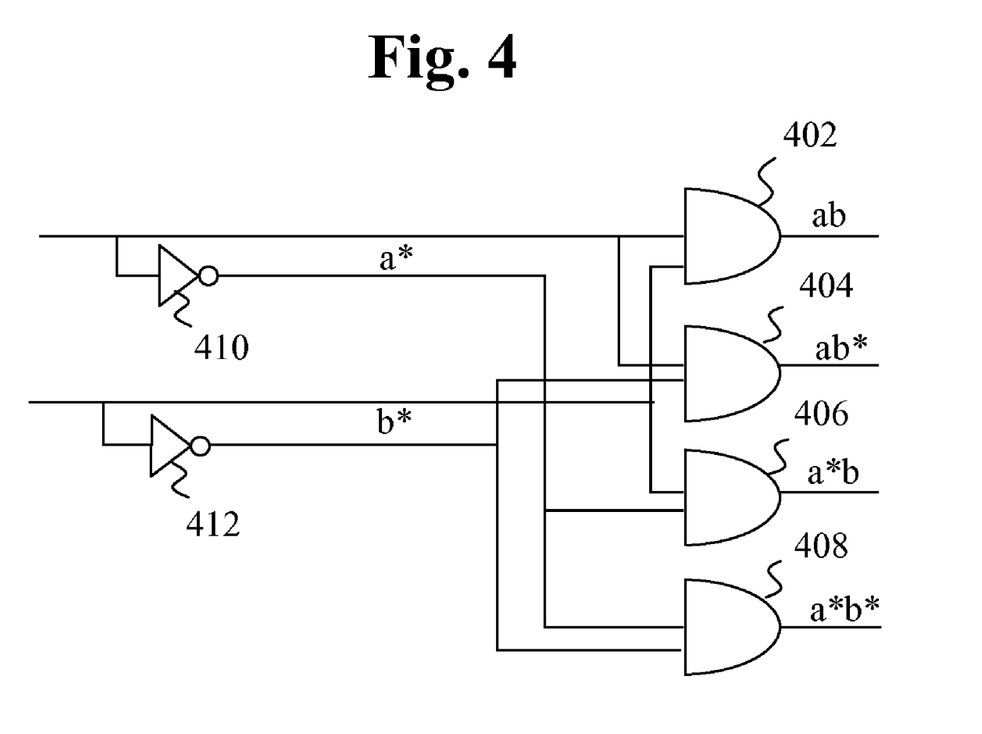
FIGS. 4, 4*a* and 4*b* show matchline voltage delay for the cells shown in FIGS. 2 and 3, respectively.
Figure 4A:
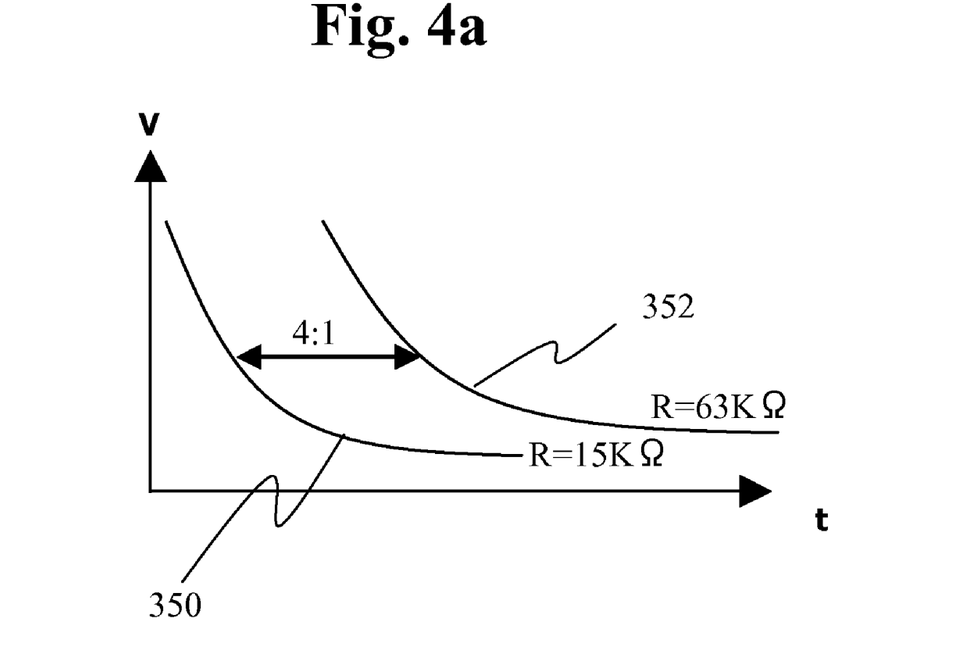
Figure 4B:
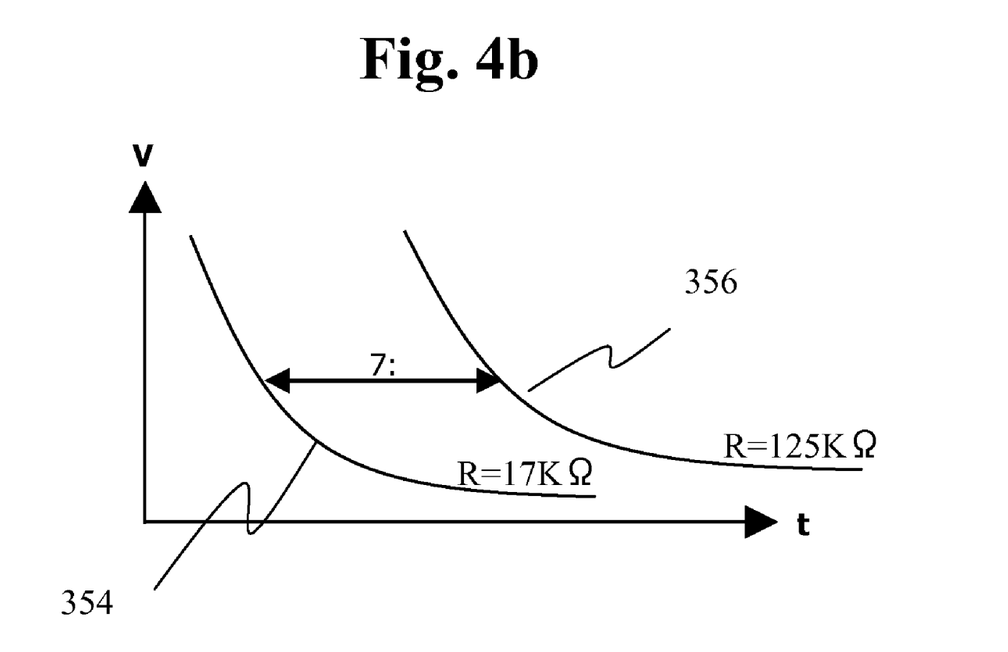

FIGS. 4a and 4b show examples of possible match line resistance curves for the cells described in FIGS. 2 and 3, respectively. It shall be understood that because each match line is coupled through resistive elements and switching devices, in both a match case where an R is connected to an open switch and a no-match case, the voltage on the match line decays at a time directly proportional to the resistance between the match line and ground. The further apart these curves are, the easier it is resolve whether the match line indicates a match or a no-match condition. In one embodiment, it has been found that about a 4 to 1 resistance variation is needed for accurate resolution. It shall be understood that the variation needs to be between the slowest no-match delay and the fastest match delay.

Consider 32 1-bit cells of FIG. 2 coupled to a match line. In this example, assume R=2M ohms and r=20 k ohms. The slowest delay of a no-match condition occurs when there is a PCM device of resistance "r" in series with an activated (closed) switch. The delay is shown as curve 350 in FIG. 4a. The RC delay is proportional to $R_{eff}=R/31 \| r$ where $\|$ indicates the resistors are in parallel. In this example, $R_{eff}$ is equal to approximately 15 k ohms. The fastest delay condition occurs when all 32 cells have an R coupled to an activated (closed) switch. Accordingly, the curve of for such a condition (352) has an effective resistance of R/32 which equal approximately 63 k ohms. The time difference between the two curves 350 and 352 is approximately 4 to 1 which comports with the 4 to 1 resistance variation desirable for resolving match and no-match conditions.

As discussed above, utilizing the two-bit cell shown in FIG. 3 provides only one discharge path for two one-bit cells. This is one half the discharge paths allowed by the configuration of FIG. 2. Accordingly, for a 32 bit input, only 16 resistive elements may ever be discharging at any given time. The slowest discharge for a no-match, shown as curve 354 of FIG. 4b occurs when 1 of 16 resistive elements are coupled to an activated switch. Thus, for curve 354 (utilizing the above values) $R_{eff}=15/R \| r$. Utilizing the above values, $R_{eff}$ for curve 354 is approximately 17 k ohms. The effective resistance for the fastest match discharge (shown as curve 356) may be solved as $R_{eff}=R/16$ which is approximately equal to 125 k ohms. The time difference between the two curves 354 and 356 is approximately 7 to 1 which far exceeds the 4 to 1 resistance variation desirable for resolving match and no-match conditions. This may allow for two results. First, utilizing the 2-bit cells of FIG. 3 may allow for greater certainty in resolve match or no-match conditions. Alternatively, utilizing the 2-bit cells of FIG. 3 may allow for more cells to coupled to a particular match line without loosing resolution ability.

The above description has dealt with a 2-bit cell. It shall be understood that these teachings could also be applied to any number of bit cells. For example, each cell could contain three one-bit cells and a 3-8 decoder may be used. In such an embodiment, the match to no-match resistance ratio may increase as the number of grouped bits increases. In a general sense, the number of bits that may be grouped is not limited and, accordingly, the decoder may be an n to $2^n$ decoder where n is the number of grouped bits.

Figure 5:
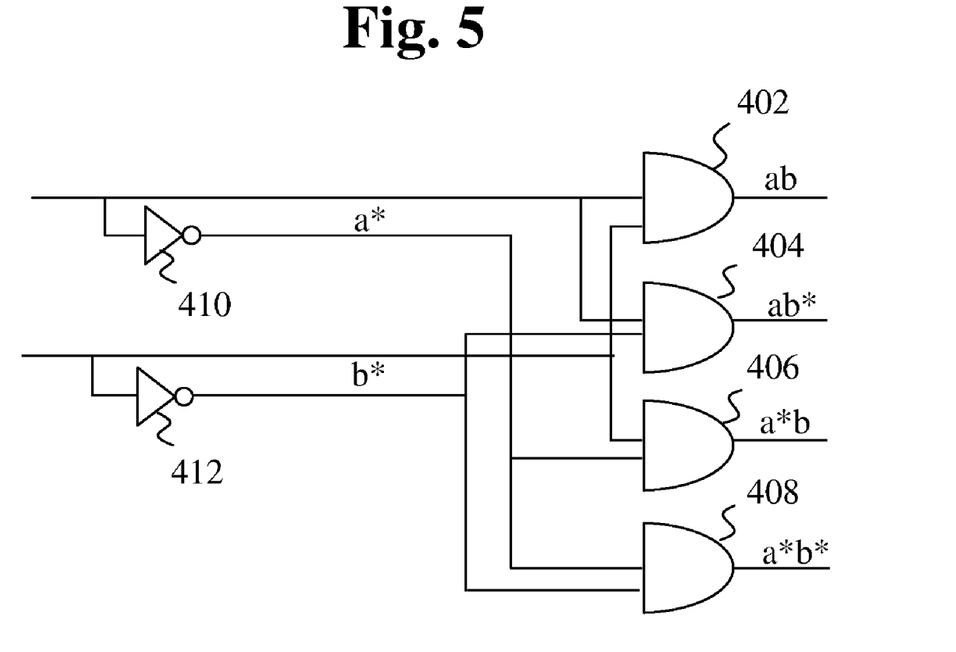
FIG. 5 shows an example of logic that may be used to decode an input vector according to one embodiment of the present invention.

FIG. 5 shows one example of a circuit 400 that may be used to perform the 2-4 decoding in hardware. Of course, this circuit 400 could be simplified and implemented differently. The input signals a and b have their complements a* and b* created, respectively, by NOT gates 410 and 412. AND gate 402 ANDs a and b together to create ab, AND gate 404 ANDs a and b* to together to create ab*, AND gate 406 ANDs a* and b to together to create a*b, and AND gate 408 ANDs a* and b* to create a*b*. Of course, in the event that X is an allowed input, provisions may be made for such an input. For example, each X could be cause the decoder to create two different addresses, one where the X is a 1 and one where the X is a zero.

Figure 6:
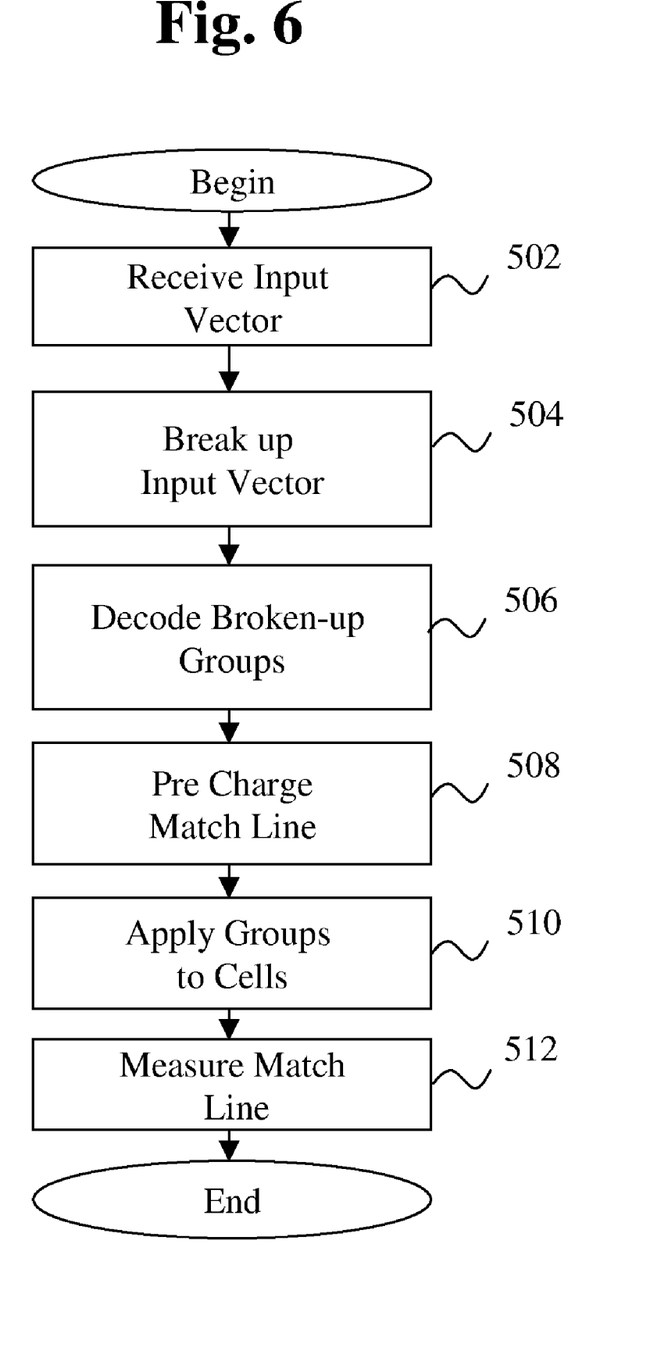
FIG. 6 is a flow chart showing one method of operating a CAM according to the present invention.

FIG. 6 is a flow chart showing a method of searching a CAM for a particular input vector according to an embodiment of the present invention. At a block 502 a search vector is received. In one embodiment, this search vector may have an even number of bits. Of course, an even number is not required based on the addressing scheme being implemented but an even number is assumed for the rest of the description of FIG. 5 and it is assumed that the 1-bit cells are grouped into groups of 2-bit cells.

At a block 504, the input vector is split into groups of two bits. For example, assume a binary input vector of 110100 was received at block 502. This input vector would be broken up (in lowest order to highest order) into the following groupings: 00, 01, and 11. Of course, the groupings could be different based on the number of cells in particular grouping. For example, if 3 cells are grouped to form a three bit cell, the grouping would be 100 and 110.

Regardless, at a block 506 the groupings are decoded in the manner as described above. At a block 508 the match line is pre-charged. At a block 510 the decoded inputs are applied to the select lines of the multi-bit cells as described above. At a block 512 the resistive state of the match line is measured to determine whether a match has been made.

Figure 7:
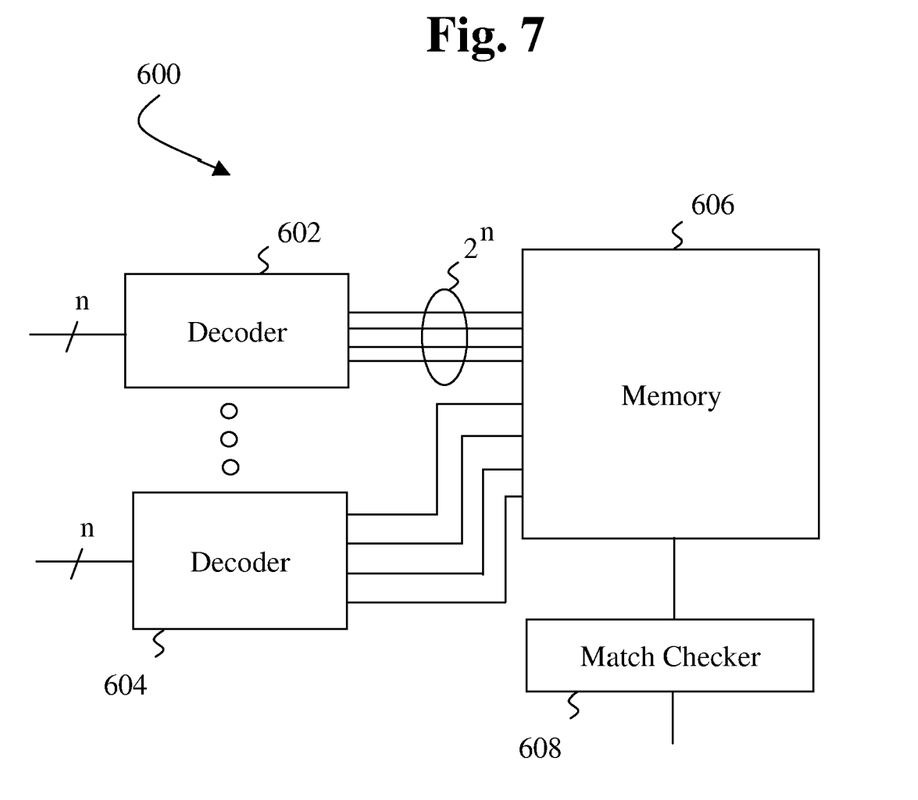
FIG. 7 is a block diagram of system according to one embodiment of the present invention.

FIG. 7 shows a block diagram of a system 600 in which the present invention may be implemented. The system includes a decoder 602. The decoder 602 receives an input vector and converts it into coded inputs for individual memory cells within the memory 606. It shall be understood, that the decoder converts n input bits into $2^n$ input bits in one embodiment. In such and embodiments, each grouping of bits may include its own decoder. Accordingly, the system 600 may include any number of decoders and FIG. 7 shows two decoders 602 and 604. The decoders may be implemented in hardware, software, or a combination of both.

The system 600 may also include a memory 606. In one embodiment, the memory 600 may be a CAM. In another embodiment, the memory 600 may be a ternary CAM. In either embodiment, the memory may be constructed of a plurality of cells such as those described with respect to FIG. 1 and having one or more match lines that couple them together.

The system 600 may also include a match checker 608 that determines if the input vector matches an address stored in the memory 606. This may be determined, for example, by measuring a resistance level of one or more match lines contained in the memory 600. As discussed above, the teachings contained herein may increase the match/no-match resistance ratio and increase the accuracy of a determination by the match checker 608 of whether a match exists or not.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A memory device for storing one or more addresses, the memory device comprising:
   a match line;
   a first memory cell, the first memory cell including a first memory element coupled to a second memory element and to the match line, the first memory cell also including a first access device coupled to the first memory element and having a first access line and a second access device coupled to the second memory element and having a second access line, the first memory cell configured to store a first value; and
   a second memory cell, the second memory cell including a third memory element coupled to a fourth memory element and to the match line, the second memory cell also including a third access device coupled to the third memory element having a third access line and a fourth access device coupled to the fourth memory element and having a fourth access line, the second memory cell configured to store a second value;
   wherein each of the access lines receives a signal that is a different combination of the first and second values.

2. The memory device of claim 1, wherein the memory device is content addressable memory and wherein the first value may be a logical 1 or a logical 0 and the second value may be a logical 1 or a logical 0.

3. The memory device of claim 1, wherein the memory device is a ternary content addressable memory and where in the first value may be a logical 1, a logical 0 or a don't care and the second value may be a logical 1, a logical 0 or a don't care.

4. The memory device of claim 1, wherein the first, second, third and fourth memory elements are resistive memory elements.

5. The memory device of claim 4, wherein the first, second, third and fourth memory elements are formed of a phase change material.

6. The memory device of claim 1, where all of the access lines are coupled to a combination of the first and second values.

7. The memory device of claim 6, wherein:
   the first access line is coupled to a combination of a complement of the first value and a complement of the second value;
   the second access line is coupled to a combination of the complement of the first value and the second value;
   the third access line is coupled to a combination of the first value and the complement of the second value; and
   the fourth access line is coupled to the first value and the second value.

8. The memory device of claim 1, wherein the first, second, third and fourth access devices are transistors all include a gate terminal.

9. The memory device of claim 8, wherein the access lines are each coupled to a gate terminal.

10. The memory device of claim 1, further including a third memory cell coupled to the match line.

11. A method of operating a content addressable memory, the method comprising:
receiving an input vector at a decoder;
decoding the input vector, decoding including dividing the input vector into a plurality of 2 bit groupings and performing logical operations on each of the groupings to create a plurality of addressing values;
transmitting the addressing values to access lines coupled to memory cells within the content addressable memory; and
measuring a resistive value of a match line within the content addressable memory and coupled to the memory cells.

12. The method of claim 11, further comprising:
precharging the match line.

13. The method of claim 11, wherein decoding includes:
forming a first access signal by ANDing the complement of a first bit of a first one of plurality of two bit grouping with the complement of the second bit of the first one of the plurality of two bit groupings;
forming a second access signal ANDing the complement of the first bit with the second bit;
forming a third access signal by ANDing the first bit with the complement of the second bit; and
forming a fourth signal by ANDing the first bit and the second bit.

14. The method of claim 13, wherein forming is done by a hardware decoder.

15. The method of claim 13, wherein transmitting includes:
applying the first, second, third and fourth access signals to different ones of the access lines.

16. A memory system comprising:
a content addressable memory including plurality of memory cells coupled to a match line;
a match checking device coupled to a content addressable memory that determines if a particular input applied to the content addressable memory is contained the content addressable memory by monitoring a resistive level of the match line; and
a decoder coupled to the content addressable memory that receives an input address and decodes at least two of the bits from the address into four unique outputs.

17. The system of claim 16, wherein a first unique output is coupled to a first access line and second unique output is coupled to a second access line, the first and second access lines both being connected to a first memory cell within the content addressable memory.

18. The system of claim 17, wherein a third unique output is coupled to a third access line and a fourth unique output is coupled to a fourth access line, the third and fourth access lines both being connected to a second memory cell within the content addressable memory.

19. The system of claim 16, wherein the plurality of memory cells are formed by phase change materials.

20. The system of claim 17, wherein the content addressable memory is a ternary content addressable memory.

* * * * *